United States Patent [19]
Forte

[11] 4,349,752
[45] Sep. 14, 1982

[54] MAGNETIC COUPLE DRIVE CIRCUIT FOR POWER SWITCHING DEVICE

[75] Inventor: Luciano Forte, Spring Valley, N.Y.

[73] Assignee: Reliance Electric Company, Cleveland, Ohio

[21] Appl. No.: 172,669

[22] Filed: Jul. 28, 1980

[51] Int. Cl.³ .................. H03K 17/60; H03K 3/26
[52] U.S. Cl. ............................ 307/254; 307/255; 307/314; 307/315
[58] Field of Search .............. 307/254, 253, 239, 315, 307/314

[56] References Cited

U.S. PATENT DOCUMENTS 3,610,963 10/1971 Higgins ........................ 307/253
3,820,008 6/1974 Guarnaschelli .................. 307/253
4,005,317 1/1977 Hinrichs ........................ 307/253
4,066,916 1/1978 King et al. ...................... 307/253
4,087,703 5/1978 Akamatsu ....................... 307/253

Primary Examiner—Stanley D. Miller, Jr.
Assistant Examiner—B. P. Davis
Attorney, Agent, or Firm—Ronald R. Stanley

[57] ABSTRACT

The present invention teaches a magnetically coupled drive circuit for coupling isolated power switching transistors to low power dissipative control circuitry. Drive energy stored in the magnetic transformer is controllably varied between preselected minimum "turn-on" and dissipative maximum levels to concurrently insure turn-on/turn-off capability and minimize quiescent, steady state dissipation.

7 Claims, 1 Drawing Figure

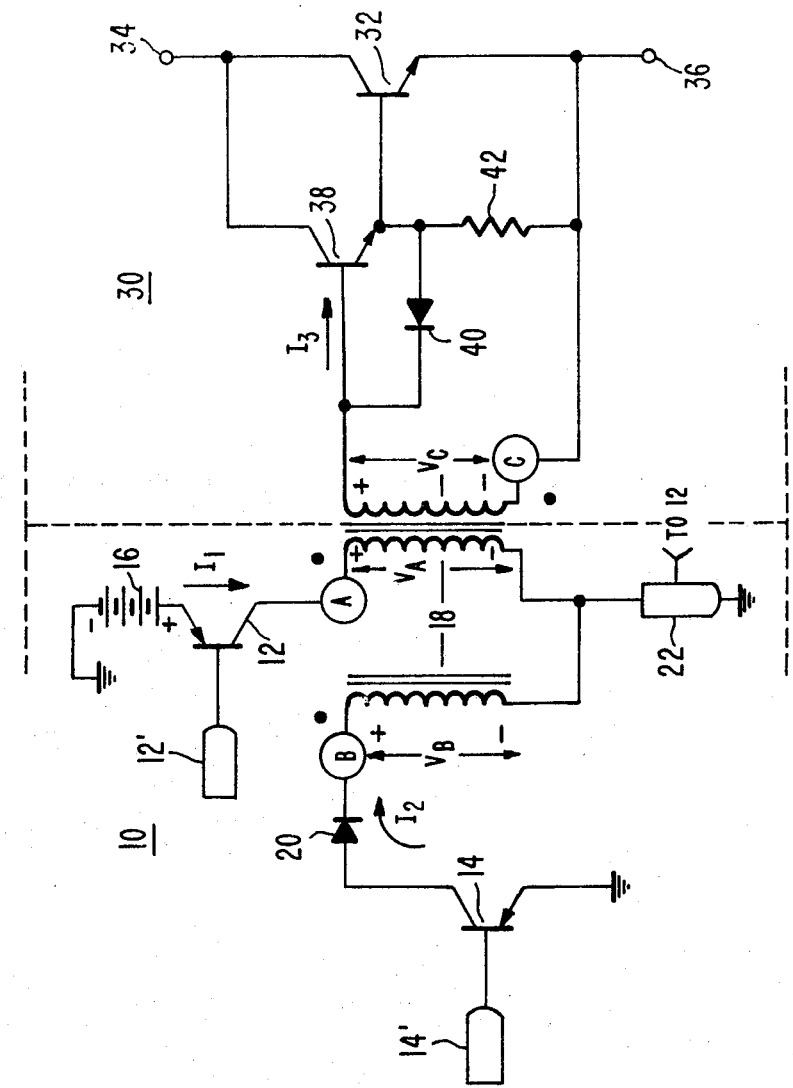

MAGNETIC COUPLE DRIVE CIRCUIT FOR POWER SWITCHING DEVICE

BACKGROUND OF THE INVENTION

Field of the Invention

The present invention relates generally to drive circuits for controlling the turn-on/turn-off of power switching devices and more particularly to a magnetic couple drive circuit for coupling isolated power switching transistors to a minimum dissipation control circuit. The present inventive circuitry provides high speed turn-on/turn-off control of relatively high power switching devices while concurrently minimizing control circuit dissipation.

Transformer-coupled transistor drive circuits are well known in the art. These circuits commonly include regenerative current drive for the switching transistor(s) turn-on/turn-off, wherein the output current of the power transistor is transformer coupled back into the (base) drive circuit of the switching transistor(s). Specific examples of these prior art circuits may be found in U.S. Pat. Nos. 3,983,418, 3,986,052 and 4,123,670. This regenerative or enhanced turn-on/turn-off technique restricts the utility of those circuits in applications where the enhancement section of the circuit experiences transient or noise signals. Transients in the switched signal are generally amplified by the regenerative turn-on circuitry and applied to the switching control of the circuit, resulting in mis-triggering of the switching device(s). In contrast, the present drive circuitry utilizes the energy stored in the coupling magnetic to provide the requisite turn-on/turn-off drive, providing virtually total isolation of the switching devices from the control circuitry.

The art has recognized the aforedescribed deficiencies and circuits have been designed to isolate the power switching devices from the control drive circuitry. In general these circuits inductively couple stored energy through a magnetic between drive and switching circuitry. Examples of such circuits may be found in U.S. Pat. Nos. 3,820,008; 4,005,317; 4,177,393 and 4,087,703. These circuits are generally deficient in one or both of two aspects, either the control circuit is substantially dissipative during the quiescent or non-conductive period of the power switching device and-/or the turn-on/turn-off capability of the drive circuit is restricted to specified time intervals, effectively slowing the turn-on/turn-off capability of the circuit. In most prior art circuits, overcoming one of these deficiencies typically worsens the other deficiency.

In contrast to the aforedescribed prior art circuits, the present invention teaches a high speed turn-on/turn-off drive circuit whose low power control circuitry is virtually isolated from the power switching device(s) yet provides turn-on/turn-off drive capability at substantially all times. In a quiescent state, that is to say during steady state non-conduction of the power switching device, the control circuitry is nominally dissipative, yet maintains virtually ever present ability to quickly drive the power switching devices into and from saturated conduction and non-conduction.

SUMMARY OF THE INVENTION

The present invention teaches a magnetic couple drive circuit for coupling virtually isolated power switching transistor(s) to low power dissipative control circuitry. A plurality of control transistors maintain a sufficient level of energy inductively stored in the coupling magnetic to quickly drive the power switching transistor(s) into and from non-conductive and saturation states. The energy stored in the magnetic is controlled to vary between preselected minimum and maximum values to insure ever-present turn-on/turn-off capability and minimize quiescent state non-conductive dissipation. The circuit provides enhanced efficiency for relatively high power switching applications.

BRIEF DESCRIPTION OF THE DRAWINGS

FIG. 1 is a schematic illustration of the circuitry of one embodiment of the present invention.

DETAILED DESCRIPTION OF THE INVENTION

By way of general outline, here follows first a description of one embodiment of the circuitry of the present invention followed by a detailed description of the operation of the circuit.

Referring to FIG. 1, the switching circuit there shown may generally be divided, for ease of illustration, into two sections. A first section, collectively designated 10, comprises the control section of the circuitry. The control circuitry comprises first and second control transistors, 12 and 14 respectively, each having a base electrode coupled to independent control signal means, correspondingly designated 12' and 14'. For purposes of the present invention control signal means 12' and 14' are capable of selectively and independently providing a sufficient control signal to transistors 12 and 14 to render them substantially conductive or to clamp them in a non-conductive state. Transformer 18 comprises a first primary winding and first and second secondary windings. For purposes of illustration, one terminal (hereinafter a start) of each of the primary and first and secondary windings are designated A, B and C respectively. The first control transistor 12 has its main current conduction path coupled between a voltage source 16 and start A of the primary winding. The second control transistor 14 has its main current conduction path coupled between a reference or ground potential through diode 20 to start B of the first secondary of transformer 18. Diode 20 is coupled to permit current flow into the start of the secondary winding. The end or remaining terminals of the primary and first secondary windings are commonly coupled through voltage/current sensing means 22 to ground or reference potential. As described in detail hereinafter, control signal means 12' and 14' are responsive to sensing means 22.

A second section of the circuit, generally termed the switching circuitry, is collectively designated 30. A relatively high power switching device 32, having a main current conduction path coupled between terminals 34 and 36 is connected in a Darlington configuration with transistor 38. The second secondary winding of transformer 18 is coupled to the Darlington switch, having start C connected to the emitter of transistor 32 (also terminal 36) and the remaining end of the second secondary winding is connected to the base electrode of transistor 38. Unidirectional current bypass is provided by diode 40 and register 42, coupled between start C and the commonly connected base electrode of transistor 38 and remaining end of second secondary winding.

Circuit Operation

The principals of operation and advantages of the magnetic couple drive circuit of the present invention are most aptly described in terms of the circuits operating states. In the first operating state, hereinafter condition 1, the base to emitter voltage, $V_{BE}$, of first and second control transistors 12 and 14 respectively, are sufficient to forwardly bias the control transistors, permitting current conduction therethrough, An increasing (with respect to time) current $I_1$, whose time constant is a function of the magnitude of inductance of the magnetic circuit, flows through control transistor 12 into start A of the magnetic's primary winding upon the application of a voltage supplied by source 16. A voltage is induced in the first secondary winding of the magnetic, reverse biasing diode 20, whereby no current is permitted to flow therethrough. A voltage is induced in the second secondary winding of the magnetic, reverse biasing switching transistor 32 and 38. A relatively small amount of current, which is dependent upon the resistance value of resistor 42, flows into start C. Darlington coupled switching transistors 32 and 38 remain turned off. The current in the magnetic is monitored by 22; whenever $I_1$, reaches a predetermined value, a control signal is provided to turn off control transistor 12, hereinafter condition II.

Condition II: the stored energy in the magnetic induces a voltage in the first primary, opposite in polarity to the induced voltage of condition I, forward biasing diode 20 and permitting a current $I_2$ to flow into start B and through monitoring means 22. In a preferred embodiment, a relatively low saturation voltage of transistor 14 and a relatively low forward bias voltage drop of diode 20, clamps the first secondary induced voltage to a correspondingly low value. A step-down turns ratio between the magnetics first secondary and second secondary windings operates to induce a voltage in the second secondary winding of the magnetic which is insufficient to forward bias the switching transistors, therefore, transistors 32 and 38 remain non-conducting. Absent further conditions described hereinafter, when current $I_2$ decays to a predetermined minimum value (detected by monitoring means 22), a control signal is provided to again turn on the first control transistor 12 while concurrently maintaining the second control transistor 14 turned on. Condition I is then repeated.

The circuitry may cycle between condition I and condition II until switching transistor drive capability is required. The cycling of condition I and condition II minimizes the circuits power dissipation during "ready" or non-drive mode. The cycling is of further advantage in minimizing the power carrying requirements of the control circuit components. Furthermore, controlled variation of the magnetic's stored energy between preselected minimum "turn-on" and dissipation maximum levels concurrently insures ever-present turn-on/turn-off capability and minimize quiescent, steady state nonconductive dissipation.

Condition III comprises the rapid turn-on of switching transistors 32 and 34. During any of conditions I or II, a drive control signal will concurrently turn off both control transistors 12 and 14. An amount of energy stored in the magnetic about equal to $\frac{1}{2} LI_t^2$ where L is the value of the winding inductance for the magnetic and $I_t$ is the current flowing in the winding for the magnetic at the time the drive signal is given ($I_t$ will vary, as described heretofore, between predetermined maximum and minimum values during conditions I and II). The concurrent turn-off of both control transistors 12 and 14 open-circuits the primary and first secondary of the magnetic. The stored energy induces a sufficient voltage in the second secondary, giving rise to base drive current $I_3$ to quickly drive the switching transistors 32 and 38 into saturation, providing rapid turn-on of these transistors.

Condition IV comprises the rapid turn-off of the switching transistors. To provide rapid turn-off of the switching transistors 32 and 38, first control transistor 12 is turned back on by control means 12'. The current flowing into start A of the first primary of the magnetic induces a voltage in the second secondary, opposite in polarity to the previously described turn-on drive voltage, providing a base clearing current limited only by the low impedance of the magnetic, to rapidly turn-off the switching transistors 32 and 38. To assist one skilled in the art, the following example details one embodiment of the present invention.

EXAMPLE I

This example details design parameters for one embodiment of the present invention. A magnetic couple drive circuit, substantially identical to the circuit illustrated in FIG. 1 to which reference will be made, was construced to provide rapid turn-on/turn-off of power switching transistors. Although suitable alternatives would include SCR, VMOS and other transistor configurations. Bipolar power switching transistors were coupled in darlington configuration. Design parameters included providing a base drive turn-on current $I_3$ ranging from 8.0 to 6.0 amperes for a maximum switching transistor conduction period $T_{III}$ of about 0.833 milli seconds (Condition III). The combined base to emitter voltage $V_{BE}$ of the darlington configured switching transistors, during conduction, is about 2.0 volts and a maximum reverse bias of about 3.0 volts.

Magnetic 18 comprises an iron core transformer having a primary and first and second secondary windings. The magnetic was selected to have a time constant (L/R) which was substantially greater than the switching transistors conduction period $T_c$. The inductance of the second secondary winding was determined to be:

$$L_{SS} \cong [V_{BE}(38) + V_{BE}(32)] \times T$$

$$\cong \frac{2 \text{ volts} \times 0.833 \times 10^{-3} \text{ seconds}}{2.0 \text{ amperes}}$$

$$\cong 0.833 \text{ millihenries}$$

A turns ratio between the primary and second secondary windings of 8 to 1 was selected. Therefore the maximum primary winding voltage, $VA_{MAX}$, was $VA \cong$ Reverse Bias Max. Voltage $\times$ Turns Ratio $VA_{MAX} \cong 24$ volts The turns ratio between the primary and first secondary winding was selected as 1, therefore current $I_1 \cong$ current $I_2$ and $$I_1 \text{ minimum} = I_2 \text{ minimum} = \frac{I_3 \text{ max}}{\sim} = 1 \text{ amp.}$$

The inductances of the primary winding $L_A$ and the first secondary winding $L_B$ was determined as:

$L_A \cong L_B \cong L_C \times (\text{Turns Ratio})^2 = 0.8 \text{ mH} \times (8)^2 \cong 53.3$ millihenries The duration of Condition I, control transistors 12 and 14 being forward biased into conduction, was determined as:

$$t_I \cong \frac{\Delta I_1 \times L_A}{V_a}$$

where
$\Delta I_1$ is 0.05 amperes
$t_I = 0.111$ milliseconds

The duration of Condition II, the turn-off of control transistor 12, was determined as:

$$t_{II} = \frac{\Delta I_2 \times L_B}{V^c_{BE}(14) + V_D(20)}$$

where $\Delta I_2 = \Delta I_1 = 0.05$ amperes and $V^c_{BE}(14) + V_D(20)$, the voltage drops across the conducting transistor 14 and diode 20 was about 2.0 volts.

$$t_{II} \cong \frac{0.05 \text{ amps.} \times 53.3 \text{ mh}}{2.0 \text{ volts}} = 1.33 \text{ milliseconds}$$

In determining the duration of Condition IV, upon completion of Condition III, $I_3$ had decayed to 6.0 amps., transistor 12 had been returned to a conducting state and an initial value of $I_1$ was:

$$\Delta I'_1 \cong 1.0 \text{ amp.} - 0.75 \text{ amp.} = 0.25 \text{ amp. and}$$

$$t_{IV} \cong \frac{\Delta I'_1 \times L_A}{V_A}$$

$$t_{IV} \cong \frac{0.25 \text{ amps.} \times 53.3 \text{ mh}}{24 \text{ volts}}$$

$$t_{IV} \cong 0.555 \text{ milliseconds}$$

The maximum duty cycle was accordingly determined to be:

$$\text{Duty Cycle} = \frac{T_{III}}{T_{III} + T_{IV}} \cong 60\%$$

What is claimed is:

1. A magnetically coupled drive circuit for low power control of high current carrying switching devices, said drive circuit comprising:
a magnetic transformer having a primary winding and first and second secondary windings;
a first and second control transistor, said first control transistor being coupled between a source of voltage and an input to the primary winding of the magnetic transformer, said second control transistor being coupled between an input to the first secondary of the magnetic transformer and ground, each said transistor being independently responsive to individual control signals;
diode means interposed between the second control transistor and the input to the first secondary of the magnetic transformer;
current sensing means connected between commonly coupled terminals of the primary and first secondary of the magnetic transformer and ground, said sensing means providing a control signal to said first control transistor rendering same non-conductive when sensing a predetermined current maximum in the magnetic transformer's primary, and rendering same conductive when sensing a predetermined current minimum;
high current switching means including at least one switching transistor having a base and emitter electrode coupled to the second secondary of the magnetic transformer whereupon said first and second control transistors concurrently receive a turn-off non-conductive control signal, a drive signal is provided to said switching means of sufficient magnitude to render same substantially conductive.

2. A magnetically coupled switching circuit for high speed switching of relatively high power switching devices which devices are isolated from a low power dissipative control circuit, said switching circuit comprising:
a coupling magnetic transformer having a primary and first and second secondary windings;
a first and second control transistor, each being independently responsive to a first and second control signal respectively, said first control transistor having its main current conduction path coupled between a power supply means and one terminal of the primary winding coupling magnetic transformer, said second control transistor having its main current conduction path coupled between a reference potential and a terminal of the first secondary winding of the magnetic transformer;
diode means interposed between said second control transistor and the terminal of said first secondary winding;
current sensing means coupled between a reference potential and a commonly connected terminal of the primary and first secondary windings of the magnetic transformer;
at least one relatively high power switching device having their base electrodes coupled to receive a drive signal from the second secondary winding of the magnetic transformer wherein response to a drive signal is generated by concurrent turn-off of both control transistors, a turn-on signal of sufficient magnitude comprising energy stored in the magnetic transformer is applied to the base of said switching device, rendering same substantially conductive.

3. The switching circuit of claim 1 or 2 wherein said at least one switching device comprises two Darlington coupled switching transistors and further including current bypass means permitting unidirectional current flow between the terminals of the second secondary winding of the magnetic transformer.

4. The switching circuit of claim 1 or 2 wherein said magnetic transformer comprises an iron core transformer having a primary to first secondary winding ratio of 1 to 1 and a primary to second secondary winding ratio of about 8 to 1.

5. The switching circuit of claim 2 wherein said switching transistors comprises bipolar transistors and said control signal is generated in response to a predetermined current level minimum and current level maximum determined by said current sensing means where in response to said current minimum a turn-on control signal is supplied to the base of both the first and second control transistor and in response to said current maximum a turn-off control signal is applied to the base of the second control transistor.

6. The switching circuit of claim 2 wherein said magnetic transformer has a time constant which is substantially greater than a conduction time of said switching transistors.

7. A magnetically coupled switching circuit for high speed turn-on and turn-off of relatively high power switching transistors comprising:

a magnetic transformer having a primary winding and first and second secondary windings, said magnetic transformer having a turns ratio of about 8 to one for the primary to second secondary windings and a turns ratio of about one to one for the primary to first secondary windings, said magnetic transformer being further characterized as having a time constant L/R which is substantially greater than a turn-on period of said switching transistors;

a first and second control transistor comprising relatively low power transistors, each being independently responsive to a first and second control signal, respectively, said first control transistor having its main current conduction path coupled between a power supply means and one terminal of the primary winding and having its base electrode coupled to receive a control signal, said second control transistor having its main current conduction path coupled between a reference potential and a terminal of the first secondary winding and having its base electrode coupled to receive a control signal;

diode means interposed between said second control transistor and the terminal of said first secondary winding;

current sensing means coupled between a reference potential and a commonly connected terminal of the primary and first secondary windings of the magnetic transformer, said current sensing means being responsive to current flowing in the primary and first secondary windings of the magnetic transformer, where in response to a predetermined current maximum a control signal is produced to turn off said first control transistor and in response to a predetermined current minimum a control signal is produced to turn on said first control transistor;

at least one relatively high power switching device each having a base electrode coupled to receive a drive signal from the second secondary winding of the magnetic transformer where in response to a drive signal being generated by concurrent turn-off of both control transistors, a turn-on drive signal of sufficient magnitude comprising energy stored in the magnetic transformer is applied to the base of said switching device, rendering same substantially conductive, said switching transistor(s) remaining turned-on for a period of time $T_c$ which is less than the time constant of the magnetic transformer.

* * * * *